United States Patent [19]

Kim et al.

[11] Patent Number: 5,781,135
[45] Date of Patent: Jul. 14, 1998

[54] HIGH SPEED VARIABLE LENGTH CODE DECODER

[75] Inventors: Su Hwan Kim, Seoul; Seong Ok Bae, Kyungki-Do, both of Rep. of Korea

[73] Assignee: LG Electronics Inc., Seoul, Rep. of Korea

[21] Appl. No.: 749,564

[22] Filed: Nov. 15, 1996

[30] Foreign Application Priority Data

Nov. 15, 1995 [KR] Rep. of Korea ............... 1995-41557

[51] Int. Cl.⁶ ............................................. H03M 7/40
[52] U.S. Cl. ............................................. 341/67
[58] Field of Search ............................ 341/67, 63, 65

[56] References Cited

U.S. PATENT DOCUMENTS

5,666,116  9/1997  Bakhumtsky ........................ 341/67
5,677,690  10/1997  Sohn ...................................... 341/67

Primary Examiner—Brian K. Young

[57] ABSTRACT

A high speed variable length code (VLC) decoder for decoding in real time data encoded in a system such as MPEG 1, MPEG 2 or HDTV (high definition television) includes a bit stream buffer, a data buffer, a pair of latch units, a pair of selectors, a barrel shifter, a VLC table random logic, an output buffer, an accumulator, and a VLC decoder controller. The VLC decoder controller appropriately controls data flow in the VLC decoder, by using a bit empty signal from the bit stream signal, a data empty signal from the data buffer, a data full signal from the output buffer and a carry signal from the accumulator.

14 Claims, 6 Drawing Sheets

| A1–A10 | B1–B14 | C1–C30 | D1–D8 | E1–E32 | • • • • |

FIG. 2B
CONVENTIONAL ART

| CLOCK | DATA BUFFER OUTPUT | FIRST LATCH | SECOND LATCH | BARREL SHIFTER OUTPUT | READ | RESIDUE LATCH | SHIFT VALUE | CARRY/RESIDUE |
|---|---|---|---|---|---|---|---|---|
| 1 | A1-A10 / C9-C30 / B1-B14 / D1-D14 / C1-C8 / E1-E2 | / A1-A10 / B1-B14 / C1-C8 | | | 1 | 0 | 0 | 0 |
| 2 | C9-C30 / D1-D4 / E3-E32 / E1-E2 / | A1-A10 / C9-C30 / B1-B14 / D1-D14 / C1-C8 / E1-E2 | / A1-A10 / B1-B14 / C1-C8 | A1-A10 / B1-B14 / C1-C8 | 1 | 0 | 0 | 0/10 |
| 3 | E3-E32 ... | C9-C30 / D1-D14 / E1-E2 | A1-A10 / B1-B14 / C1-C8 | B1-B14 / C1-C8 | 0 | 10 | 10 | 0/24 |
| 4 | " | C9-C30 / D1-D14 / E1-E2 | A1-A10 / B1-B14 / C1-C8 | C1-C30 / D1-D2 | 0 | 24 | 24 | 1/22 |
| 5 | E3-E32 ... / ..... | C9-C30 / D1-D14 / E3-E32 / E1-E2 | A1-A10 / C9-C30 / B1-B14 / D1-D14 / C1-C8 / E1-E2 | B13-B14 / D1-D8 / C1-C30 / E1-E24 | 1 | 22 | 24 | 0/30 |

| CARRY | OUTPUT BUFFER FULL | DATA BUFFER EMPTY | BIT STREAM BUFFER EMPTY | OUTPUT (INTERNAL CONTROL SIGNAL) |
|---|---|---|---|---|
| 1 | x | 1 | 1 | 00 |
| 1 | x | 1 | 0 | 00 |
| 1 | x | 0 | 1 | 01 |
| 1 | x | 0 | 0 | 10 |
| 0 | 1 | x | x | 01 |
| 0 | 0 | x | x | 11 |

FIG. 5

| CLOCK | DATA BUFFER OUTPUT | FIRST MULTIPLEXER | FIRST LATCH | SECOND MULTIPLEXER | SECOND LATCH | BARREL SHIFTER | SECOND LATCH UNIT | READ | RESIDUE LATCH | SHIFT VALUE | FORCED INITIAL INPUT | CARRY/ RESIDUE |
|---|---|---|---|---|---|---|---|---|---|---|---|---|
| 1 | A1-A10 B1-B14 C1-C8 | A1-A10 B1-B14 C1-C8 | . | . | . | . | . | [1] | [0] | 0 | [0] | 1/0 |
| 2 | C9-C30 D1-D8 E1-E2 | C9-C30 D1-D8 E1-E2 | A1-A10 B1-B14 C1-C8 | A1-A10 B1-B14 C1-C8 | . | A1-A10 B1-B14 C1-C8 | . | [1] | [0] | 0 | [0] | 1/0 |
| 3 | E3-E32... | " | C9-C30 D1-D8 E1-E2 | " | A1-A10 B1-B14 C1-C8 | B1-B14 C1-C18 | A1-A10 B1-B14 C1-C8 | 0 | 0 | 10 | 10 | 0/10 |
| 4 | " | " | " | " | " | C1-C30 D1-D2 | B1-B14 C1-C18 | 0 | 10 | 24 | 14 | 0/24 |
| 5 | " | " | " | " | " | B13-B14 C1-C30 D1-D8 E1-E24 | C1-C30 D1-D2 | 0 | 24 | 22 | 30 | 1/22 |
| 6 | " | E3-E32 | " | C9-C30 D1-D8 E1-E2 | " | D1-D8 E1-E24 E1-E32 | B13-B14 C1-C30 | 1 | 22 | 22 | 0 | 0/22 |
| 7 | " | " | E3-E32... | " | C9-C30 D1-D8 E1-E2 | E1-E32 | D1-D8 E1-E24 | 0 | 22 | 30 | 8 | 1/30 |

HIGH SPEED VARIABLE LENGTH CODE DECODER

BACKGROUND OF THE INVENTION

1. Field of the Invention

The present invention relates to a variable length code (hereinafter, "VLC") decoder for high speed data transmission, and more particularly to a high speed VLC decoder capable of decoding in real time data encoded in a system such as MPEG 1, MPEG 2 or HDTV (high definition television).

2. Description of the Prior Art

In general, motion pictures require large memory space, a bandwidth and a high speed process capability for storage, transmission and processing to deal with an increasing amount of data.

To decrease as much distortion as possible and also to store and transmit data at minimum cost, an appropriate compression technique is required with regard to motion pictures.

Such data compression technique is related to restoring compressed data for being applied to a variable length encoding method frequently employed in a non-loss compression, under which technique a fixed length data is converted into a variable length code in accordance with statistic properties of data.

To change a variable length code under the knowledge of a statistic property of data, a data with a high frequency is assigned to a short code word and yet a data with a low frequency is allocated to a long code word. When a variable length code word is assigned to a library for every possible source code word, an average code length for a variable length becomes shorter than the source data average code word length, thereby proceeding data compression.

Huffmann Coding is usually applied to composing a minimum variable length code according to a statistic property of data.

To restore the compressed data for storage, transmission and processing, an encoded data must be decoded at a data receiving-end. However, because all the code words must be separated from each other before being decoded into the source symbols thereof according to the variable length property, the data processing for decoding the encoded data can be much more complicated. So, the design of a VLC decoder becomes more difficult than that of a variable length encoder.

In a system such as MPEG 1, MPEG 2 or HDTV, a VLC decoder forms a function block by being connected to several peripheral circuits thereof, and the speed of the function block decides the longest delay time at a portion between the VLC decoder and its peripheral circuits.

At this time, an output data of the VLC table random logic can be stored in an input buffer of another function block but in most cases employed for an input function of a peripheral circuit or stored in an input buffer for another function block after being transformed into an appropriate type in another function block.

With regard to a VLC decoder applied to MPEG 1, MPEG 2 or HDTV, there should be considered a longest time delay occurring at a connection portion between a VLC decoder and its peripheral circuits, as well as an inner longest time delay of the VLC decoder caused by complexity at its peripheral circuit.

As a VLC decoder with a faster data processing speed is required, studies are being made for reducing the longest delay time in a VLC decoder.

With reference to the accompanying drawings, the composition and function of a conventional VLC decoder will now be described.

Figure 1:
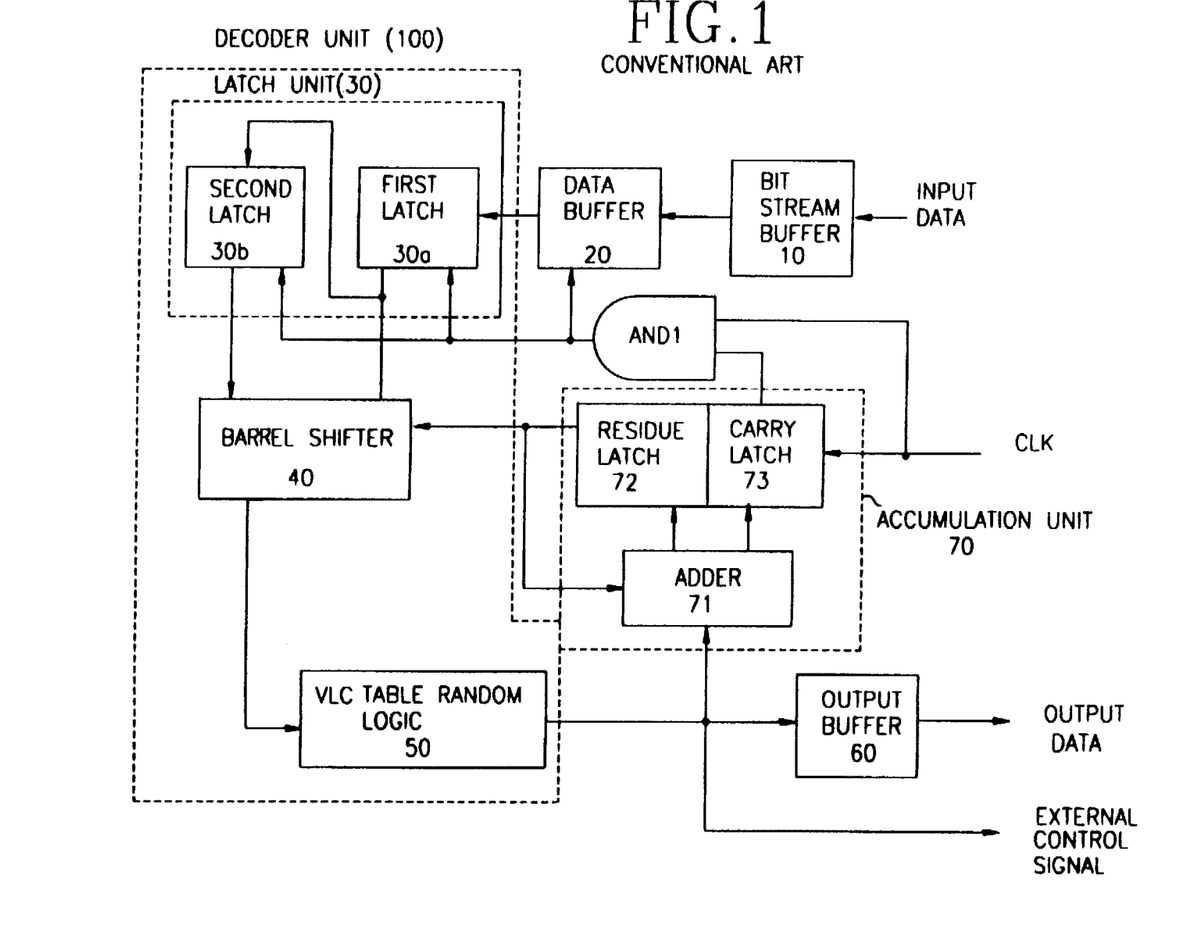
FIG. 1 is a block diagram of a conventional VLC decoder.

As shown in FIG. 1, a conventional VLC decoder includes a bit stream buffer 10, a data buffer 20, a decoder unit 100 and an accumulator 70.

The bit stream buffer 10 receives an externally applied series bit stream data and configures into a certain unit the received bit stream data for fast process. The data buffer 20 serves to receive and store therein the configured data from the bit stream buffer 10, and output the stored data to a first latch 30a in the decoder unit 100.

The decoder unit 100 includes a latch unit 30, a barrel shifter 40 and a VLC table random logic 50 and serves to decode a variable length code word by using a bit stream data and then outputs a fixed length code word in accordance with a read signal generated by a fixed symbol clock rate. Here, the barrel shifter 40 has the most significant bit (MSB) in the left portion thereof.

The latch unit 30 includes the first latch 30a for storing in accordance with a read signal the data applied thereto from the data buffer 20 and outputting the stored data therefrom, and a second latch 30b for storing by a read signal the data applied thereto from the first latch 30a and outputting the stored data therefrom.

The accumulation unit 70 includes an adder 71 for adding to a previous residue value the bit length value of the code word decoded in the VLC table random logic 50, a residue latch 72 for outputting the previous residue to the barrel shifter 40 using a transfer signal, and a carry latch 73 for receiving a carry value outputted from the adder 71 and outputting the carry value together with a clock signal CLK through an AND gate AND1 to the data buffer 20 and the latch unit 30, respectively. Here, the read signal results from an AND operation between an output signal of the carry latch 73 and a clock signal CLK.

Figure 2A:
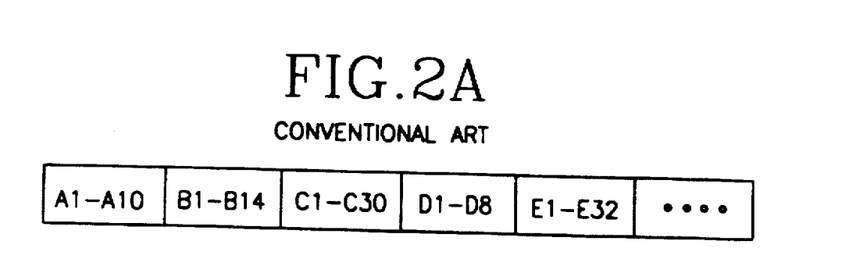
FIG. 2A is a block diagram showing an example of a bit stream data.
Figure 2B:
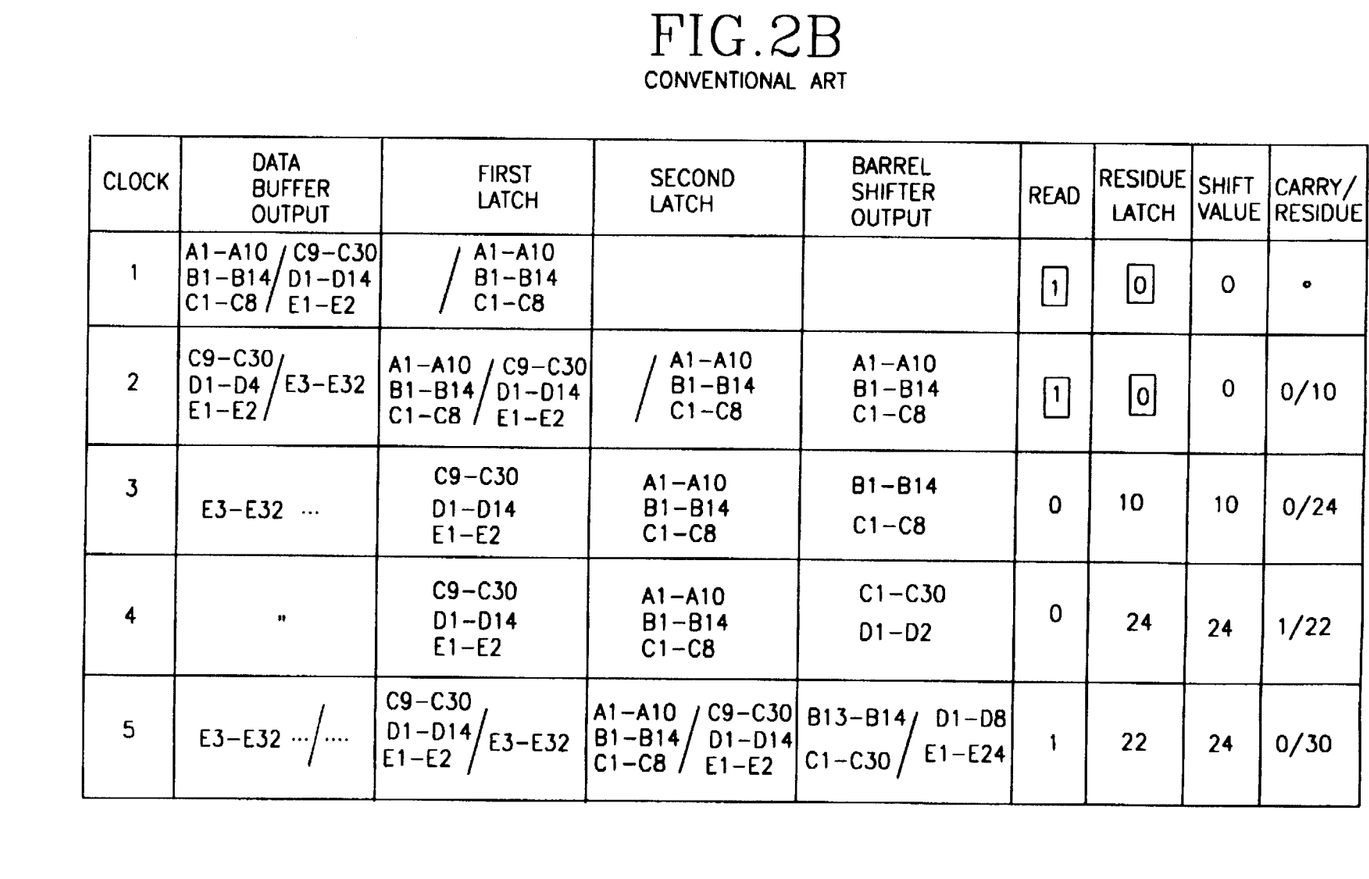
FIG. 2B is a block diagram for explaining the operation of the conventional VLC decoder according to the sequence of clock signals.

With reference to FIGS. 2A and 2B, the operation of the conventional VLC decoder will now be described.

First, as shown in FIG. 2A, a series bit stream data $(A_1-A_{10}, B_1-B_{14}, C_1-C_{30}, D_1-D_8, E_1-E_{32}, \ldots)$ having 32 bits as a longest variable length code word is externally applied to the bit stream buffer 10, which stores the variable length bit stream data therein and configures the stream data into 32-bit parallel data such as a first data $(A_1-A_{10}, B_1-B_{14}, C_1-C_8)$, a second data $(C_9-C_{30}, D_1-D_8, E_1-E_2)$ and a third data $(E_3-E_{32}, \ldots)$ and then outputs the resulting data to the data buffer 20.

As shown in FIG. 2B, at a first clock signal, a read signal is set high in accordance with a carry signal serving as a ready-set high level output signal outputted from a carry latch 73 and a clock signal and is transmitted simultaneously to each of the data buffer 20, the first latch 30a and the second latch 30b. Here, the series of configured 32-bit data are stored in the data buffer 20 sequentially. The data buffer 20 outputs the data stored therein to the first latch 30a when the read signal is high and then stores the second data $(C_9-C_{30}, D_1-D_8, E_1-E_2)$ therein. At this time, after a read signal is transited from low to high, the first latch 30a stores therein the first data $(A_1-A_{10}, B_1-B_{14}, C_1-C_8)$ outputted from the data buffer 20.

At a second clock signal, the read signal is set high in accordance with a high carry signal outputted from the carry latch 73 and a clock signal, and is applied once again to the data buffer 20, the first latch 30a and the second latch 30a, respectively. Then, the data buffer 20 sends to the first latch 30a the second data $(C_9-C_{30}, D_1-D_8, E_1-E_2)$ ready-stored therein according to the read signal and at the same time stores therein the third data ($E_3$–$E_{32}$, ... ).

At this time, the first latch 30a outputs the first data ($A_1$–$A_{10}$, $B_1$–$B_{14}$, $C_1$–$C_8$) ready-stored therein to the second latch 30b and to the latter 32-bit half of the barrel shifter 32 and at the same time receives from the data buffer 20 the second data ($C_9$–$C_{30}$, $D_1$–$D_8$, $E_1$–$E_2$). Accordingly, the second latch 30b stores therein the first data ($A_1$–$A_{10}$, $B_1$–$B_{14}C_1$–$C_8$) outputted from the first latch 30a and outputs the same to the former 32-bit half of the barrel shifter 40.

Therefore, in the former half of the barrel shifter 40 there is provided the first data ($A_1$–$A_{10}$, $B_1$–$B_{14}$, $C_1$–$C_8$) applied thereto from the second latch 30b and in the latter half thereof there is provided the second data ($C_9$–$C_{30}$, $D_1$–$D_8$, $E_1$–$E_2$) applied thereto from the first latch 30a. In FIG. 2B, the residue value and read signal are each referred to as "0" and "1" for showing ready-set values thereof.

Next, the VLC table random logic 50 serves to receive the first data ($A_1$–$A_{10}$, $B_1$–$B_{14}$, $C_1$–$C_8$) in the former half of the barrel shifter 40 and decode the first code word ($A_1$–$A_{10}$; 10 bits) among the data applied thereto. The decoded data can be used as a control signal for another function block and transmitted to the adder 71 in the accumulator 70 and the output buffer 60.

The adder 71 adds to the previous value zero the bit length value "10" of the decoded coded word ($A_1$–$A_{10}$) and divides the resulting value "10" by the bit length value "32" for a 32-bit value. When 10 is divided by 32, the carry value becomes zero and its residue value "10" is provided to the residue latch 72, and the carry value "0" is to the carry latch 73.

At a third clock signal, since the carry latch 73 generates a low level carry signal, a read signal becomes low and the latch unit 30 maintains the previous value. However, the residue value "10" transmitted thereto from the residue latch 72 is fedback to the adder 71 and serves to transmit the shift value "10" to the barrel shifter 40, which in turn outputs therefrom a 10-bit length value among the former half thereof.

The barrel shifter 40 configures 32-bit data by summing up the front-bit data ($B_1$–$B_{14}$, $C_1$–$C_8$) other than the decoded code word ($A_1$–$A_{10}$) in the first data ($A_1$–$A_{10}$, $B_1$–$B_{14}$, $C_1$–$C_8$) and a part of the second rear-bit data ($C_9$–$C_{30}$, $D_1$–$D_8$, $E_1$–$E_2$) thereby outputting the configured data ($B_1$–$B_{14}$, $C_{1-C18}$) to the VLC table random logic 50.

In the VLC table random logic 50, as shown in decoding the code word ($A_1$–$A_{10}$), the code word ($B_1$–$B_{14}$) is decoded in the data ($B_1$–$B_{14}$, $C_1$–$C_{18}$). The decoded data is used as a control signal in a different function block, or transmitted therefrom to the adder 71 in the accumulation unit 70 and the output buffer 60 respectively. Then, the adder 71 adds the bit length value "14" of the decoded code word ($B_1$–$B_{14}$) to the previous value "10", and the summed value "24" is divided by 32, thereby sending the value zero and "24" to the carry latch 73 and residue latch 72, respectively.

At a fourth clock signal, the residue latch 72 feedbacks the residue value "24" to the adder 71 and transmits the shift value "24" to the barrel shifter 40, by which shift value signal the residue bits ($C_1$–$C_8$) other than the data ($A_1$–$A_{10}$, $B_1$–$B_{14}$) decoded in the VLC table random logic 50 are added to a part of the second data ($C_{9-C30}$, $D_1$–$D_8$, $E_1$–$E_2$) so as to be configured into a 32-bit data ($C_1$–$C_{30}$, $D_1$–$D_2$), whereby the configured data is applied to the VLC table random logic 50, which decodes the code word ($C_1$–$C_{30}$) to be used as an external signal or transmits the bit length value "30" for the code word ($C_1$–$C_{30}$) to the adder 71 of the accumulator 71 and the output buffer 60, respectively.

The adder 71 adds the decoded bit length value "30" to the previous residue value "24" outputted from the residue latch 72. The resulting value "54" is divided by 32 and then the carry value "1" and the residue value "22" are outputted to the carry latch 73 and the residue latch 72, respectively.

At the third and fourth clocks when the 64-bit data stored in the barrel shifter 40 are decoded and then transferred by one code word therein, no variation with regard to the stored data occurs in any of the data buffer 20, the first latch 30a and the second latch 30b.

At a fifth clock signal, the carry latch 73 transmits a high level read signal simultaneously to each of the data buffer 20, the first latch 30a and the second latch 30b. Then, the data buffer 20 sends the ready-stored data ($E_3$–$E_{32}$, ... ) to the first latch 30a, which sends the ready-stored data ($C_9$–$C_{30}$, $D_1$–$D_8$, $E_1$–$E_2$) to each of the latter half of the barrel shifter 40 and the second latch 30b while receiving a data ($E_3$–$E_{32}$, ... ) from the data buffer 20. The second latch 30b sends the ready-stored data ($A_1$–$A_{10}$, $B_1$–$B_{14}$, $C_1$–$C_8$) to the former half of the barrel shifter 40 and at the same time receives a data ($C_9$–$C_{30}$, $D_1$–$D_8$, $E_1$–$E_2$) from the first latch 30a.

Therefore, the data ($A_1$–$A_{10}$, $B_1$–$B_{14}$, $C_1$–$C_8$) is applied to the former half in the barrel shifter 40 and the data ($C_9$–$C_{30}$, $D_1$–$D_8$, $E_1$–$E_2$) is applied to the latter half thereof.

At this time, the residue value "22" outputted from the residue latch 72 is fedback to the adder 71 and at the same time to the barrel shifter 40 as a shift value.

In accordance with the shift signal, the rest of the data except for the ready-decoded data ($A_1$–$A_{10}$, $B_1$–$B_{14}$, $C_1$–$C_{30}$) of the data ($A_1$–$A_{10}$, $B_1$–$B_{14}$, $C_1$–$C_8$ and $C_9$–$C_{30}$, $D_1$–$D_8$, $E_1$–$E_2$) stored in the barrel shifter 40 is configured into a 32bit data ($D_1$–$D_8$, $E_1$–$E_{24}$) which is in turn outputted to the VLC table random logic 50.

The VLC table random logic 50 decodes the first code word ($D_1$–$D_8$) among the data (D1–D8, E1–E24) and the resulting value is used as an external signal or sends the bit length value "8" of the decoded code word ($D_1$–$D_8$) to the adder 71 and the output buffer 60, respectively.

The adder 71 adds the decoded bit length value "8" to the previous residue value "22" has the resulting value "304" divided by 32 and then sends zero and 30 to the carry latch 73 and the residue latch 72, respectively.

The conventional VLC decoder repeats the above-described operation at each of the accompanying clock signals.

However, the conventional VLC decoder has an disadvantage in that because it can not be decoded during a half-clock signal, the delayed time becomes shorter than the half-clock when a clock signal passes through a carry latch, a first latch, a second latch, a barrel shifter, a VLC table random logic and an adder.

Further, because a VLC decoder in a system such as MPEG 1, MPEG 2 or HDTV simply denotes one of multiple blocks, when an output buffer is full of data despite its mission for controlling data flow depending on the conditions of the blocks connected to the VLC decoder, the code word data on the way to being decoded can be extinct.

SUMMARY OF THE INVENTION

Accordingly, it is an object of the present invention to provide a high speed variable length code (VLC) decoder for expediting the process speed by effectively employing a most delay time.

It is another object of the present invention to provide a high speed VLC decoder capable of reducing a most delay time by adding a control block for appropriately controlling data flowing between the VLC decoder and each of the peripheral devices.

To achieve the above-described objects, the high speed VLC decoder in accordance with the present invention comprises: a bit stream buffer for storing therein an externally applied variable bit stream data, configuring the stored data into 32bit parallel data, and outputting therefrom the configured data, but outputting therefrom a bit empty signal when there is no data stored therein; a data buffer for sequentially storing therein 32bit data applied thereto from the bit stream buffer in accordance with a read signal but outputting therefrom a bit empty signal when there is no data stored therein; a first latch unit for temporarily storing therein the data applied thereto from the data buffer and outputting therefrom the stored data in accordance with the read signal; a first selector for outputting therefrom the data applied thereto from the first latch unit in accordance with the read signal; a barrel shifter for outputting therefrom a certain number of bits stored therein, after being shifted by a shift signal; a second latch unit for temporarily storing the data applied thereto from the barrel shifter and outputting therefrom the stored data in accordance with an internal control signal; a VLC table random logic for decoding the data applied thereto from the second latch unit and outputting a code word and a bit length value in the code word; an output buffer for storing and outputting therefrom the value applied thereto from the VLC table random logic, or outputting therefrom a data full signal when full of data; a second selector selectively outputting therefrom a bit length value applied thereto from the VLC table random logic and a ready-set value "0", each in accordance with the read signal; an accumulator for receiving the value applied thereto from the second selector, generating the read signal and transmitting a shift signal to the barrel shifter; and a VLC decoder controller for receiving the read signal, the bit empty signal, the data empty signal and the data full signal, respectively, and outputting an internal control signal to each of the accumulator and the second latch for properly controlling the data flow.

BRIEF DESCRIPTION OF THE DRAWINGS

The objects and advantages of the present invention will be clear with the accompanying drawings, wherein.

DETAILED DESCRIPTION OF THE PRESENT INVENTION

With reference to the accompanying drawings, the present invention will now be explained. Here, the same reference numeral is given for each of the same components in all the drawings.

Figure 3:
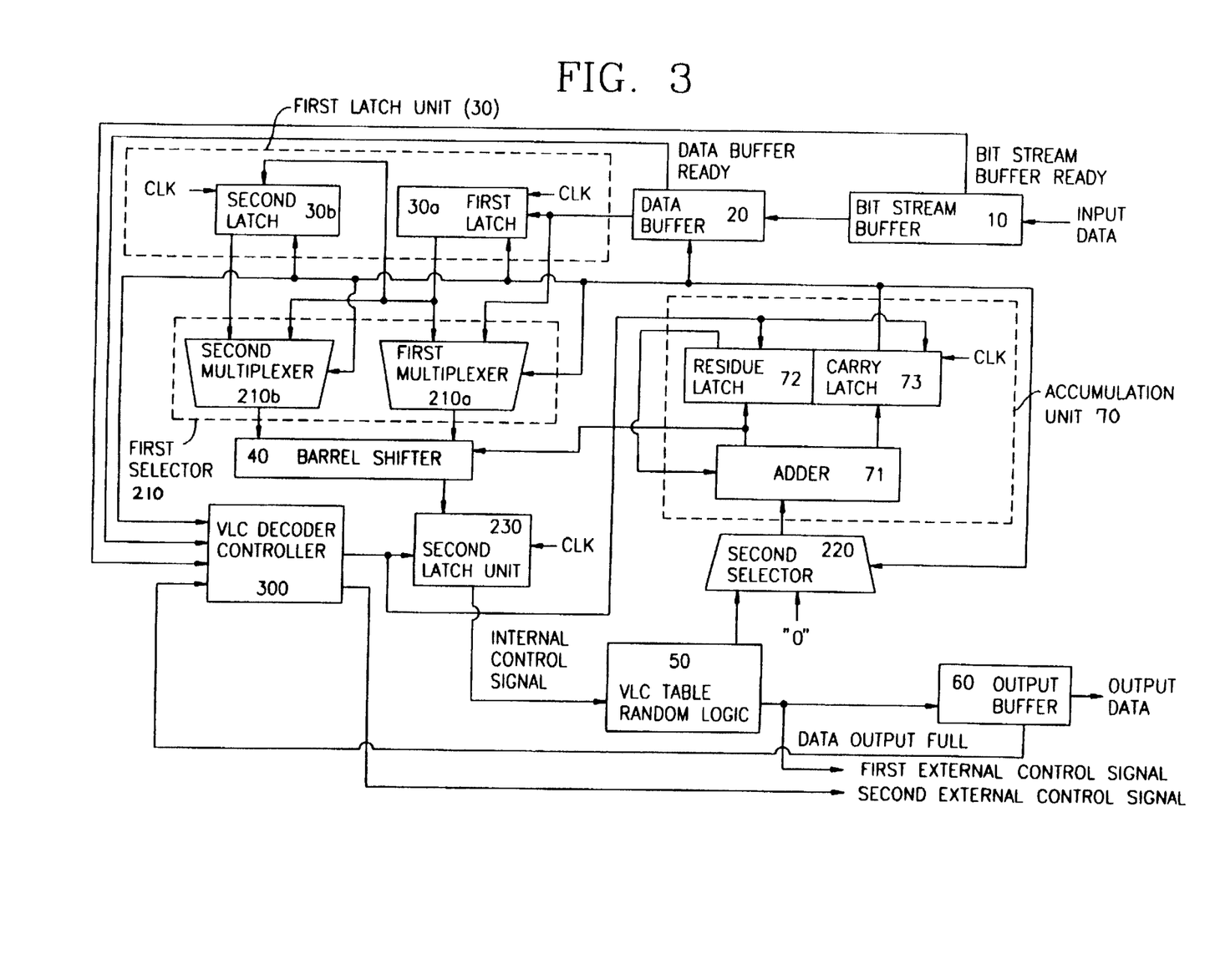
FIG. 3 is a block diagram of a high speed VLC decoder in accordance with the present invention.

As shown in FIG. 3, a high speed VLC decoder according to the present invention includes: a bit stream buffer 20 for storing therein an externally applied variable bit stream data, configuring the stored data into 32bit parallel data, and outputting therefrom the configured data but outputting therefrom a bit empty signal when there is no data stored therein; a data buffer 20 for sequentially storing therein 32-bit data applied thereto from the bit stream buffer 10 in accordance with a read signal but outputting therefrom a bit empty signal when there is no data stored therein; a first latch unit 30 for temporarily storing the data applied thereto from the data buffer 20 and outputting the stored data in accordance with the read signal; a first selector 210 for outputting therefrom the data applied thereto from the first latch unit 30 in accordance with the read signal; a barrel shifter 40 for outputting therefrom a certain number of bits stored therein in accordance with the data applied thereto from the first selector 210, after being shifted by a shift signal; a second latch unit 230 for temporarily storing therein the data applied thereto from the barrel shifter 40 and outputting therefrom the stored data in accordance with an interior control signal; a VLC table random logic 50 for decoding the data applied thereto from the second latch unit 230 and outputting a code word and a bit length value of the code word; an output buffer 60 for storing and outputting therefrom the value applied thereto from the VLC table random logic 50 or outputting therefrom a data full signal when full of data; a second selector 220 selectively outputting therefrom a bit length value applied thereto from the VLC table random logic 50 and a ready-set value "0", respectively, in accordance with the read signal; an accumulator 70 for receiving the value applied thereto from the second selector 220, generating the read signal and transmitting a shift signal to the barrel shifter 40; and a VLC decoder controller for receiving the read signal, the bit empty signal, the data empty signal and the data full signal, respectively, and outputting therefrom the internal control signal to the accumulator 70 and the second latch 230 for properly controlling the data flow.

The bit stream 10 externally receives a series bit stream data, configures into 32bit units for a fast process and outputs to the data buffer 20 the received data. When there is no bit stream data applied to the bit stream 10, it outputs a bit empty signal to the VLC decoder controller 300. The data buffer 20 receives the 32bit configured data from the bit stream buffer 10, temporarily stores therein and outputs to the first latch unit 30 the received data.

The first latch unit 30 includes a first latch 30a for temporarily storing therein the data applied thereto from the data buffer 20 in accordance with a read signal, and a second latch 30b for temporarily storing therein and outputting therefrom the data applied thereto from the first latch 30a in accordance with a read signal. A clock signal CLK is applied to each of the first latch 30a and the second latch 30b. The first latch 30a and the second latch 30b have a capacity equivalent to the most code word length.

The first selector 210 includes a first multiplexor 210a for selectively outputting the data applied thereto from the data buffer 20 and the first latch 30a in accordance with a read signal, and a second multiplexor 210b for selectively outputting the data applied thereto from the first latch 30a and the second latch 30b in accordance with a read signal. The output from each of the first and second multiplexors 210a, 210b is applied to the barrel shifter 40.

The barrel shifter 40 provided with a 32-bit slide window which is shifted by a shift signal transmits the data applied thereto from the first selector 210 and selected by the slide window to the second latch unit 230.

The second latch unit 230 temporarily stores therein and outputs therefrom the data applied thereto from the barrel shifter 40 in accordance with an internal control signal outputted from the VLC decoder controller 300. A clock signal CLK is applied to the second latch unit 230, as applied to the first latch unit 30.

The VLC table random logic 50 decodes one code word among the data from the second latch unit 230 and outputs the decoded code word value, which is transmitted to each of the output buffer 60 and the second selector 220 or controls another external block.

The output buffer 60 stores therein and outputs therefrom the data decoded in the VLC table random logic 50, and transmits a data full signal to the VLC decoder controller 300 when it is full of data.

The second selector 220 selectively outputs the data applied thereto from the VLC table random logic 50 and a ready-set low input, respectively in accordance with a read signal. The second selector 220 may be composed of multiplexors as in the first selector 210.

The accumulator 70 includes an adder 71 for adding to a previous residue value the value of the data applied thereto selectively from the second selector 220 when a bit length value of a present code word in the second selector 220 is applied thereto, a residue latch 72 for storing therein the previous residue value, and a carry latch 73 for generating and outputting to the data buffer and the latch unit 30 a read signal in accordance with a carry value outputted from the adder 71 and an externally applied clock signal CLK.

The VLC decoder controller 300 is generally composed of combined logic and serves to appropriately control the operation of the high speed VLC decoder according to the present invention.

Figure 4:
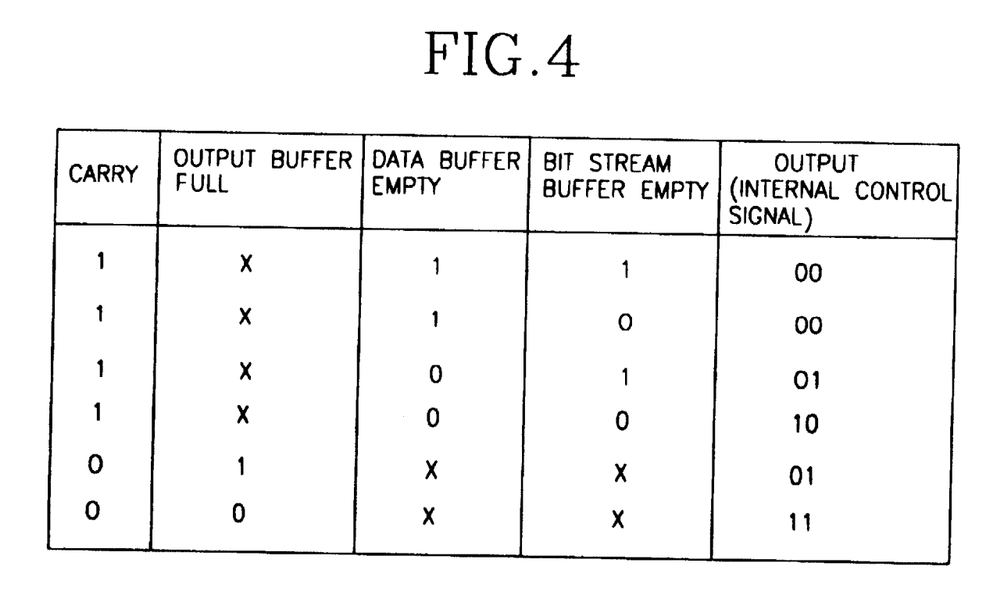
FIG. 4 is a block table showing the state of a signal outputted from a high speed VLC decoder controller in accordance with the present invention.
Figure 5:
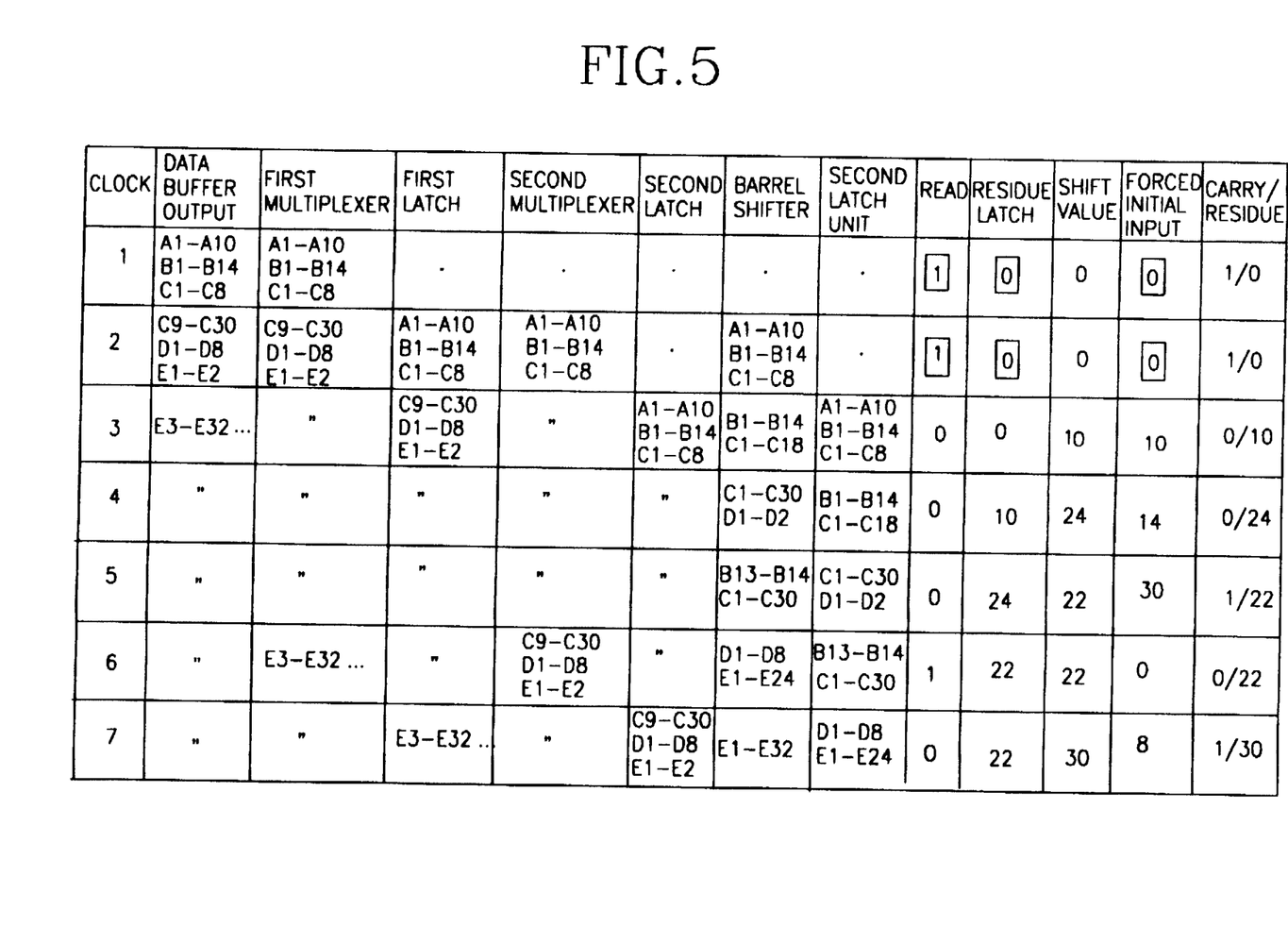
FIG. 5 is a block table for explaining the operation of the VLC decoder of the present invention according to the sequence of clock signals.

With reference to FIGS. 3 through 5, the operation of the high speed VLC decoder in accordance with the present invention will now be described.

First, as shown in FIG. 2A, a series bit stream data $(A_1-A_{10}, B_1-B_{14}, C_1-C_{10}, D_1-D_8, E_1-E_{32}, \ldots)$ having 32 bits as a longest $B_1-B_{14}, C_1-C_{30}, D_1-D_8, E_1-E_{32}, \ldots )$ having 32 bits as a longest variable length code word is externally applied to the bit stream buffer 10, which stores the variable length bit stream data therein, and configures the stream data into 32-bit parallel data such as a first data $(A_1-A_{10}, B_1-B_{14}, C_1-C_8)$, a second data $(C_9-C_{30}, D_1-D_8, E_1-E_2)$ and a third data $(E_3-E_{32}, \ldots )$ and then outputs the resulting data to the data buffer 20.

As shown in FIG. 5, at a first clock signal, a read signal outputted from the carry latch 73 is ready-set as a high level and is simultaneously transmitted to the data buffer 20, the first latch 30a, the second latch 30b, the first multiplexor 210a, the second multiplexor 210b, the VLC decoder controller 300 and the second selector 220. Here, the 32-bit configured data is sequentially stored in the data buffer 20, and the data buffer 20 outputs the first data $(A_1-A_{10}, B_1-B_{14}, C_1-C_8)$ stored therein during a high level read signal to the first latch 30a and the first multiplexor 210a and at the same time stores therein the second data $(C_9-C_{30}, D_1-D_8, E_1-E_2)$.

At this time, the first multiplexor 210a in the first selector 210 selectively outputs therefrom the first data $(A_1-A_{10}, B_1-B_{14}, C_1-C_8)$ applied thereto from the data buffer 20 because a read signal turns high. Also, one clock signal after that applied to the first multiplexor 30a, the first latch 30a stores therein the first data $(A_1-A_{10}, B_1-B_{14}, C_1-C_8)$ applied thereto from the data buffer 20.

At a second clock, a read signal which is ready-set as high is transmitted once again to the data buffer 20, the first latch 30a, the second latch 30b, the first multiplexor 210a, the second multiplexor 210b, the VLC decoder controller 300 and the second selector 220. Then, the data buffer 20 transmits the second data $(C_9-C_{30}, D_1-D_8, E_1-E_2)$ stored therein to the first latch 30a and the first multiplexor 210a and at the same time stores therein a next data $(E_3-E_{32}, \ldots )$.

At this time, the first multiplexor 30a selectively outputs therefrom the data $(C_9-C_{30}, D_1-D_8, E_1-E_2)$ applied thereto from the data buffer 20. The first latch 30a temporarily stores therein and outputs to the second multiplexor 210b and the second latch 30b the data $(A_1-A_{10}, B_1-B_{14}, C_1-C_8)$ at an edge of the second clock signal in accordance with a read signal. The second multiplexor 210b which read signal is the same high level as the first multiplexor 210a outputs therefrom the data $(A_1-A_{10}, B_1-B_{14}, C_1-C_8)$ applied thereto from the first latch 30a.

Therefore, in the former half of the barrel shifter 40 there is provided the data $(A_1-A_{10}, B_1-B_{14}, C_1-C_8)$ applied thereto from the second multiplexor 210b and in the latter half thereof an output $(C_9-C_{30}, D_1-D_8, E_1-E_2)$ from the first multiplexor 210a. At this time, because the shift value for a shift signal outputted from the accumulator 70 is zero, the barrel shifter 40 outputs the unshifted data $(A_1-A_{10}, B_1-B_{14}, C_1-C_8)$ to the second latch unit 230. Here, "0" and "1" denote the residue value and the read signal value respectively so as to ensure that those signal values are ready-set.

At a third clock signal, the second latch unit 230 transmits the data $(A_1-A_{10}, B_1-B_{14}, C_1-C_8)$ stored therein to the VLC table random logic 50 in accordance with an internal control signal of the VLC decoder controller 300.

The VLC table random logic 50 receives the data $(A_1-A_{10}, B_1-B_{14}, C_1-C_8)$ in the second latch unit 230 and decodes the first code word $(A_1-A_{10})$ among the received data. The decoded data is employed to control another function block and transmitted to the second selector 220 and the output buffer 60 and also used as a first external control signal for notifying the internal state of the VLC decoder to another block.

The second selector 220 selects 10 as a bit length value outputs the value "10" to the adder 71 of the accumulator 70. Here, another input terminal in the second selector 220 is always applied to a low level signal "0".

The adder 71 adds the bit length value "10" applied thereto from the second selector 220 to the previous value "0" applied thereto from the residue latch 72, and the resulting value "10" is divided by 32. Here, when 10 is divided by 32, the carry value is zero and the residue value becomes 10. Then, the residue value "10" is transmitted to the residue latch 72 and the barrel shifter 40, and the carry value "0" is to the carry latch 73.

Therefore, the barrel shifter 40 outputs therefrom the residue value "10" which denotes the 10-bit length value for shifting a 10-bit length from the first bit in the former half thereof.

That is, the barrel shifter 40 configures 32-bit data by summing up the front-bit data $(B_1-B_{14}, C_1-C_8)$ other than the decoded code word $(A_1-A_{10})$ and a part of the second rear-bit data $(C_9-C_{30}, D_1-D_8, E_1-E_2)$, thereby outputting the configured data $(B_1-B_{14}, C_1-C_{18})$ to the VLC table random logic 50.

The first and second multiplexors 210a, 210b in such a low level read signal maintains the previous data, and the data buffer 20 outputs therefrom the data $(E_1-E_{32}, \ldots )$ stored therein. The first and second latches 30a, 30b also outputs therefrom the data $(C_9-C_{30}, D_1-D_8, E_1-E_2)$ and $(A_1-A_{10}, B_1-B_{14}, C_1-C_8)$ each stored therein previously.

At a fourth clock signal, the second latch unit 230 transmits to the VLC table random logic 50 the data ($B_1$–$B_{14}$, $C_1$–$C_{18}$) stored therein according to the state of an internal control signal in the VLC decoder controller 300.

The VLC table random logic 50, as at the third clock signal, receives the data ($B_1$–$B_{14}$, $C_1$–$C_{18}$) from the second latch unit 230 and decodes the first code word ($B_1$–$B_{14}$) among the received data. The decoded data is transmitted to the second selector 220 and the output buffer 60 and also may be used as a control signal for another function block.

The VLC table random logic 50 sends the bit length value "14" for the decoded code word ($B_1$–$B_{14}$) to an input terminal of the second selector 220.

Then, the second selector 220 selects and outputs the adder of the accumulator 70 a bit length value "14".

The adder 71 adds the bit length value "14" to the previous value "10" applied thereto from the residue latch 71. The summed value "24" is divided by 32. When 24 is divided by 32, a carry value becomes zero and the residue value becomes 24. Therefore, the reside value "24" is sent to the residue latch 72 and the barrel shifter 40 respectively, and the carry value "0" to the carry latch 73.

Accordingly, by the value "24" serving as a shift signal the barrel shifter 40 configures into the 32-bit data ($C_1$–$C_{30}$, $D_1$–$D_2$) all the data other than the data ($A_1$–$A_{10}$, $B_1$–$B_{14}$) decoded in the VLC table random logic 50, among the parallel data ($A_1$–$A_{10}$, $B_1$–$B_{14}$, $C_1$–$C_8$, $C_9$–$C_{30}$, $D_1$–$D_8$, $E_1$–$E_2$) stored in the barrel shifter 40, and transmits the configured data ($C_1$–$C_{30}$, $D_1$–$D_2$) to the second latch unit 230. At this time, because of the low level read signal, there is no change to the data stored in each of the data buffer 20, the first latch 30a, the second latch 30b, the first multiplexor 210a, and the second multiplexor 210b.

At a fifth clock signal, the second latch unit 230 sends the data ($C_1$–$C_{30}$, $D_1$–$D_2$) applied thereto from the barrel shifter 40 to the VLC table random logic 50.

As in the fourth clock signal, the VLC table random logic 50 decodes the first code word ($C_1$–$C_{30}$) among the data ($C_1$–$C_{30}$, $D_1$–$D_2$) applied thereto from the second latch unit 230, and sends the bit length value "30" for the decoded code word (C1–C30) to an input terminal of the second selector 220. The decoded data is transmitted to the second selector 220 and the output buffer 60 and may be used as a control signal for another function block.

Next, the second selector 220 selects and sends to the accumulator 70 and the adder 71 a bit length value "3".

The adder 71 adds the bit length value "30" applied thereto from the second selector 220 to the previous value "24" in the residue latch 72 and then divides the summed value "54" by 32. Here, when 54 is divided by 32, a carry value becomes 1 and the residue value becomes 22. Next, the residue value 22 is sent to the residue latch 72 and the barrel shifter 40 and the carry value "1" is to the carry latch 73.

Therefore, the barrel shifter 40 sends to the second latch unit 230 a 32-bit data ($B_{13}$–$B_{14}$, $C_1$–$C_{30}$) which is counted the bit after the first 22 bits of the former half bits among the parallel data ($A_1$–$A_{10}$, $B_1$–$B_{14}$, $C_1$–$C_8$, $C_9$–$C_{30}$, $D_1$–$D_8$, $E_1$–$E_2$) stored in the barrel shifter 40.

At this time, because of a low level read signal, there is no change for data stored in the data buffer 20, the first latch 30a, the second latch 30b, the first multiplexor 210a and the second multiplexor 210b. Also, the data ($B_{13}$–$B_{14}$, $C_1$–$C_{30}$) outputted from the barrel shifter 40 remains invalid until a read signal turns to a high level.

At a sixth clock signal, the second latch unit 230 transmits the data ($B_{13}$–$B_{14}$, $C_1$–$C_{30}$) applied thereto form the barrel shifter 40 to the VLC table random logic 50. However, because the data ($B_{13}$–$B_{14}$, $C_1$–$C_{30}$) remains invalid, the VLC decoder stops decoding and waits for a next clock signal. Therefore, the data is not decoded and the barrel shifter 40 outputs the next data ($D_1$–$D_8$, $E_1$–$E_{24}$) to the second latch unit 230.

Also, because of the high level read signal, the first multiplexor 210a outputs the data ($E_3$–$E_{32}$) to the latter half of the barrel shifter 40 and the second multiplexor 210b outputs therefrom the data ($C_9$–$C_{30}$, $D_1$–$D_8$, $E_1$–$E_2$).

At a seventh clock signal, the second latch unit 230 transmits the data ($D_1$–$D_8$, $E_1$–$E_{24}$) applied thereto from the barrel shifter 40 to the VLC table random logic 50, which in turn decodes the first code word ($D_1$–$D_8$) among the data ($D_1$–$D_8$, $E_1$–$E_{24}$) stored in the second latch unit 230 and transmits the bit length value "8" for the decoded code word ($D_1$–$D_8$) to an input terminal of the second selector 220. Also, the decoded data is transmitted to the second selector 220 and the output buffer 60, and may be used as a control signal for another function block. Here, the second selector 220 selects and outputs to the adder 71 of the accumulator 70 the bit length value "8".

The adder 71 adds the bit length value "8" applied thereto from the second selector 220 to the previous value "22" in the residue latch 72 and then divides the summed value "30" by 32. Here, when 54 is divided by 32, a carry value becomes zero and the residue value becomes 30. Next, the residue value "30" is sent to the residue latch 72 and the barrel shifter 40 and the carry value "0" is to the carry latch 73.

Accordingly, by the value "30" serving as a shift signal the barrel shifter 40 configures into 32-bit data all the data other than the data ($D_1$–$D_8$) decoded in the VLC table random logic 50, among the parallel data ($A_1$–$A_{10}$, $B_1$–$B_{14}$, $C_1$–$C_8$, $C_9$–$C_{30}$, $D_1$–$D_8$, $E_1$–$E_2$) stored in the barrel shifter 40, and transmits the configured data ($E_1$–$E_{32}$) to the second latch unit 230. At this time, because of the low level read signal, there is no change to the data stored in each of the data buffer 20, the first latch 30a, the second latch 30b, the first multiplexor 210a, and the second multiplexor 210b. Also, the first latch 30a and the second latch 30b each output therefrom a data ($E_3$–$E_{32}$, . . . ) and a data ($C_9$–$C_{30}$, $D_1$–$D_8$, $E_1$–$E_2$).

The VLC decoder in accordance with the present invention performs the decoding operation at each of the accompanying clock signals in the same way as described above.

As shown FIG. 4, during the consecutive data decoding operations, the internal control signal is set at a two-bit state in accordance with an output buffer full signal, a data empty signal, a bit stream empty signal and a carry signal, each of which is applied to the VLC decoder controller 300.

When a read signal outputted from the carry latch 73 is a high level, and each of a bit stream buffer empty signal and a data buffer empty signal is a low level, the VLC decoder controller 300 outputs an internal control signal "10" for notifying that the bit stream buffer 10 must wait until it is filled with bit stream data.

Also, when an internal control signal is set at "01" in which a read signal outputted from the carry latch 73 is a high level and a data buffer empty signal is a low level, and it is at "00" in which each of a read signal from the carry latch 73 and a data buffer empty signal is a high level, and further it is at another "01" in which a read signal from the carry latch 73 is a low level and an output buffer full signal is a high level, then the VLC decoder controller 300 outputs therefrom a waiting signal for notifying that decoding must be stopped to wait a normal signal.

When an output buffer full signal is at a low level, a normal signal "11" for performing a decoding process at each clock signal is outputted from the VLC decoder controller 300.

Either when a read signal from the carry latch 73 is at a high level and a data buffer empty signal is at a low level, wherein an internal control signal is set at "01" or "10", or when each of a read signal outputted from the carry latch 73 and an output buffer full signal is at a low level, wherein an internal control signal is set at "00", then each of the second latch unit 230, the residue latch 72 and the carry latch 73 outputs a process signal for storing data at an ascent edge of a clock signal.

As described above, the VLC decoder in accordance with the present invention performs a fast data decoding process and appropriately controls the decoding process according to the peripheral circumstances.

The high speed VLC decoder of the present invention has the advantages in that a clock rate can be raised more than two times as much as a conventional one because data is processed during a single clock without demanding a data transition time, and also data can be decoded at a longer delay time.

Further, the high speed VLC decoder of the present invention enables the peripheral devices thereof to control data flow by notifying the data flow to the peripheral devices, thereby properly controlling data flow in a system such as MPEG 1, MPEG 2 and HDTV.

What is claimed is:

1. A high speed variable length code (VLC) decoder, comprising:

a bit stream buffer for storing therein an externally applied variable bit stream data, configuring the stored data into 32-bit parallel data, and outputting therefrom the configured data, but outputting therefrom a bit empty signal when there is no data stored therein;

a data buffer for sequentially storing therein 32-bit data applied thereto from the bit stream buffer in accordance with a read signal but outputting therefrom a bit empty signal when there is no data stored therein;

a first latch unit for temporarily storing therein the data applied thereto from the data buffer and outputting therefrom the stored data in accordance with the read signal;

a first selector for outputting therefrom the data applied thereto from the first latch unit in accordance with the read signal;

a barrel shifter for outputting therefrom a certain number of bits stored therein, after being shifted by a shift signal;

a second latch unit for temporarily storing the data applied thereto from the barrel shifter and outputting therefrom the stored data in accordance with an internal control signal;

a VLC table random logic for decoding the data applied thereto from the second latch unit and outputting a code word and a bit length value in the code word;

an output buffer for storing and outputting therefrom the value applied thereto from the VLC table random logic, or outputting therefrom a data full signal when full of data;

a second selector selectively outputting therefrom a bit length value applied thereto from the VLC table random logic and a ready-set value "0", each in accordance with the read signal;

an accumulator for receiving the value applied thereto from the second selector, generating the read signal and transmitting a shift signal to the barrel shifter; and a VLC decoder controller for receiving the read signal, the bit empty signal, the data empty signal and the data full signal, respectively, and outputting an internal control signal to each of the accumulator and the second latch for properly controlling the data flow.

2. The decoder of claim 1, wherein the first latch unit comprises a first latch for temporarily storing a data applied thereto from the data buffer and outputting therefrom the stored data, and a second latch for temporarily storing therein the data applied thereto from the first latch in accordance with the read signal and outputting therefrom the stored data.

3. The decoder of claim 2, wherein the first and second latches each have a capacity equivalent to the value of the longest code word length.

4. The decoder of claim 1, wherein the first selector includes a first selection circuit for selectively outputting the data applied thereto from each of the data buffer and the first latch in accordance with the read signal, and a second selection circuit for selectively outputting therefrom the data applied thereto from the first and second latches in accordance with the read signal.

5. The decoder of claim 4, wherein the first selector is composed of a pair of multiplexors.

6. The decoder of claim 1, wherein the barrel shifter provided with a 32-bit slide window which is shifted therein by the shift signal transmits to the second latch unit the data applied thereto from the first selector and selected by the slide window.

7. The decoder of claim 1, wherein the second latch unit temporarily stores therein and outputs therefrom the data applied thereto from the barrel shifter in accordance with the internal control signal outputted from the VLC decoder controller.

8. The decoder of claim 1, wherein the VLC table random logic decodes one code word among the data applied thereto from the second latch unit, and outputs the decoded code word value, which is in turn transmitted to each of the output buffer and the second selector or controls another external block.

9. The decoder of claim 1, wherein the output buffer stores therein and outputs therefrom the data decoded in the VLC table random logic, and transmits the data full signal to the VLC decoder controller when it is full of data.

10. The decoder of claim 1, wherein the second selector is composed of a multiplexor.

11. The decoder of claim 1, wherein the accumulator includes an adder for adding to a previous residue value the value of the data applied thereto selectively from the second selector when a bit length value of a present code word in the second selector is applied thereto, a residue latch for storing therein the previous residue value, and a carry latch for generating and outputting to each of the data buffer and the latch unit the read signal in accordance with a carry value outputted from the adder and an externally applied clock signal.

12. The decoder of claim 1, wherein the VLC decoder controller is composed of multiple combined logic and controls the operation of the VLC decoder.

13. The decoder of claim 1, wherein the barrel shifter transmits to the VLC table random logic a 32-bit data outputted from the first latch unit and allocated by a slide window.

14. The decoder of claim 13, wherein the shifting by the slide window is decided by a signal outputted from the accumulator.

* * * * *